United States Patent [19]

Benson et al.

[11] Patent Number: 4,650,919
[45] Date of Patent: Mar. 17, 1987

[54] THERMOELECTRIC GENERATOR AND METHOD FOR THE FABRICATION THEREOF

[75] Inventors: David K. Benson; C. Edwin Tracy, both of Golden, Colo.

[73] Assignee: The United States of America as represented by the United States Department of Energy, Washington, D.C.

[21] Appl. No.: 636,751

[22] Filed: Aug. 1, 1984

[51] Int. Cl.$^4$ ............................................. H01L 35/28
[52] U.S. Cl. ..................................... 136/212; 136/211
[58] Field of Search .............................. 136/205–212, 136/201; 29/573, 588; 62/3; 357/55, 81, 87

[56] References Cited

U.S. PATENT DOCUMENTS

| 3,053,923 | 9/1962 | Stearns | 136/4 |
|---|---|---|---|
| 3,607,444 | 9/1971 | DeBucs | 136/208 |
| 3,899,359 | 8/1975 | Stachurski | 136/205 |
| 4,125,122 | 11/1978 | Stachurski | 136/205 |
| 4,276,411 | 6/1981 | Wilson | 136/211 |
| 4,284,838 | 8/1981 | Indech | 136/202 |
| 4,465,894 | 8/1984 | Reyes | 136/211 |
| 4,465,895 | 8/1984 | Verner et al. | 136/211 |
| 4,497,973 | 2/1985 | Heath et al. | 136/212 |

FOREIGN PATENT DOCUMENTS 0123278  7/1984  Japan ...................................... 136/206

OTHER PUBLICATIONS

"Thermoelectric... Energy Conversion" Bohn et al., *J. Solar Engr* 1980.
"Thermoelectric . . . Energy Conversion" SERI/T-P-254, Solar Energy Research Institute, Golden, CO.

*Primary Examiner*—Stephen J. Lechert, Jr.
*Assistant Examiner*—T. J. Wallen
*Attorney, Agent, or Firm*—Kenneth L. Richardson; John M. Albrecht; Judson R. Hightower

[57] ABSTRACT

A thermoelectric generator using semiconductor elements for responding to a temperature gradient to produce electrical energy with all of the semiconductor elements being of the same type is disclosed. A continuous process for forming substrates on which the semiconductor elements and superstrates are deposited and a process for forming the semiconductor elements on the substrates are also disclosed. The substrates with the semiconductor elements thereon are combined with superstrates to form modules for use thermoelectric generators.

27 Claims, 7 Drawing Figures

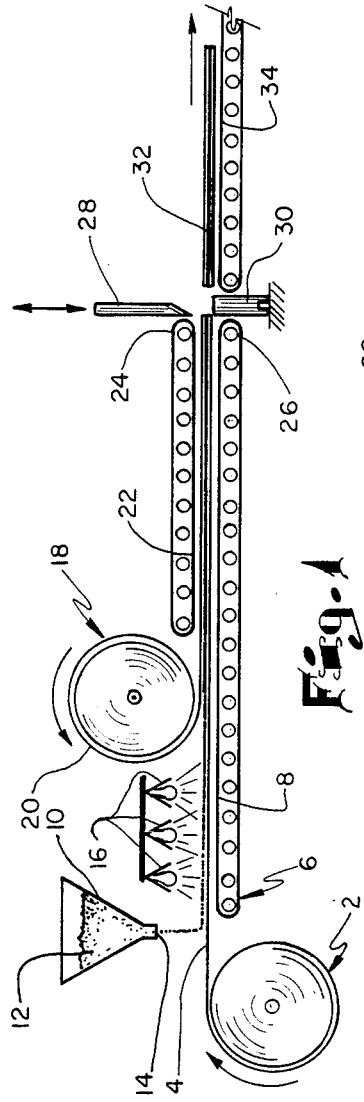
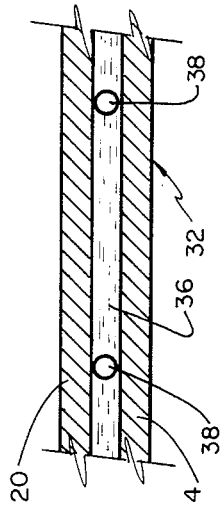
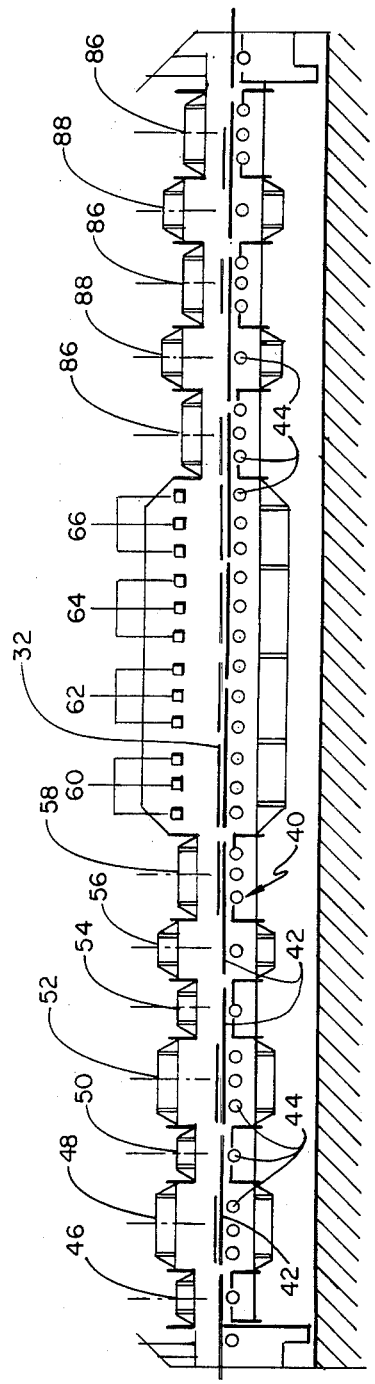

THERMOELECTRIC GENERATOR AND METHOD FOR THE FABRICATION THEREOF

CONTRACTUAL ORIGIN OF THE INVENTION

The U.S. Government has rights in this invention pursuant to Contract No. DE-AC02-83CH1 0093 between the U.S. Department of Energy and The Solar Energy Research Institute, a Division of Midwest Research Institute.

BACKGROUND OF THE INVENTION

1. Field of the Invention

This invention relates to the field of thermoelectric generators and, in particular, to thermoelectric generators using thin-film thermoelectric alloys on selected substrates.

2. Description of the Prior Art

Thermoelectric generators have been known for several years. One of the problems associated with thermoelectric generators is in relation to the relatively low efficiency of thermoelectric energy conversions. In some instances the low efficiency can be ignored if the cost of the fuel is relatively low. This is particularly true where use is made of the thermal gradients in oceans, geothermal wells, and industrial waste streams. However, even with this substantially free energy, for the thermoelectric generator to be competitive it must have an output of electrical power that is less expensive than conventional alternatives. Therefore, to be competitive, it is necessary that the cost of building thermoelectric generators be kept to a minimum.

One of the known types of thermoelectric generators comprises thin thermoelectric semiconductor elements, generally less than one millimeter in thickness, covering only a fraction, generally less than one-third, of the surface area of the heat exchanger. The bismuth telluride-antimony selenide compound is well suited for use in such thermoelectric generators, particularly for the low-temperature range, such as about 0° C. to about 200° C. In this type of thermoelectric generator, semiconductor elements are arranged in arrays with equal numbers of n-type and p-type semiconductor elements that are electrically interconnected in a series/parallel pattern chosen to provide a desirable voltage and current. In a modification of the above thermoelectric generator, only one type (either n-type or p-type) is used in each array, but in the generator module the stacked arrays are alternately n-type and p-type.

SUMMARY OF THE INVENTION

An object of this invention is to provide a method for the continuous production of a substrate, comprising a material having good electrical insulating and thermal conducting properties positioned between two layers of metal and wherein means are incorporated to ensure a uniform spacing between the layers of metal.

Another object of this invention is to provide a method wherein thin thermoelectric semiconductor elements are positioned at predetermined locations on substrates and secured thereto in an automated production system.

A further object of this invention is to provide a method wherein thin thermoelectric semiconductor elements comprising a plurality of laminated layers are positioned at predetermined locations on substrates and secured thereto in an automated production system.

Another object of this invention is to form a thermoelectric generator from substrates having thin thermoelectric semiconductor elements thereon and superstrates.

Another object of this invention is to form a thermoelectric generator having stacked arrays using only one type of semiconductor elements, i.e., n-type or p-type.

Additional objects, advantages, and novel features of the invention will be set forth in part in the description that follows, and, in part, will become apparent to those skilled in the art upon examination of the following or may be learned by practice of the invention. The objects and advantages of the invention may be realized and attained by means of the instrumentalities and combinations particularly pointed out in the appended claims.

This invention relates to a method for fabricating substrates and superstrates for use in thermoelectric generators; for fabricating thin thermoelectric semiconductor elements on such substrates; for combining a plurality of substrates having a plurality of thin thermoelectric semiconductor elements thereon and superstrates into a thermoelectric generator; and for forming a thermoelectric generator having only one type of semiconductor element, i.e., n-type or p-type.

The substrates are formed in a continuous laminating process wherein a thin layer of a low-temperature vitreous enamel is fused between two layers of metal foil. The enamel preferably contains spacing materials, such as small beads of uniform diameter, that remain solid in a liquid molten enamel. The small beads insure uniform spacing between the layers of metal foil. In the preferred embodiment, the metal foil comprises copper but it is understood that other metals having similar properties may be used. Also, the enamel preferably is a lead oxide based vitreous enamel, and the small beads are glass beads with a high silica content, although other materials having similar properties may be used.

The substrates are then provided with thin thermoelectric semiconductor elements. Specifically, the substrates move over a series of rollers through a plurality of work stations maintained at pressures comprising only a small fraction of one atmosphere and exit from the final work station with the thin thermoelectric semiconductor elements secured in a predetermined location on the substrates.

A plurality of substrates, each having thin thermoelectric semiconductor elements thereon, are provided with superstrates to form thermoelectric modules. A structure comprising a plurality of spaced-apart hollow panels are used with the thermoelectric modules to form a thermoelectric generator. The modules are placed between and in contact with adjacent hollow panels. Appropriate means are provided to flow relatively hot fluids through every other panel and cold fluids through the remaining panels. In the preferred embodiment of the invention only one type of semiconductor element (n-type or p-type) is used. Suitable electrical connections are provided so that the electric energy generated by the thermoelectric generator can be used.

The accompanying drawings, which are incorporated in and form a part of the specification, illustrate preferred embodiment(s) of the present invention and, together with the description, serve to explain the principles of the invention.

BRIEF DESCRIPTION OF THE DRAWINGS

FIG. 1 is a schematic illustration of a method for fabricating substrates.

FIG. 2 is a schematic illustration of a portion of a substrate.

FIG. 3 is a schematic illustration of a method for providing substrates with thin thermoelectric semiconductor elements.

DETAILED DESCRIPTION OF THE INVENTION

Figure 4:
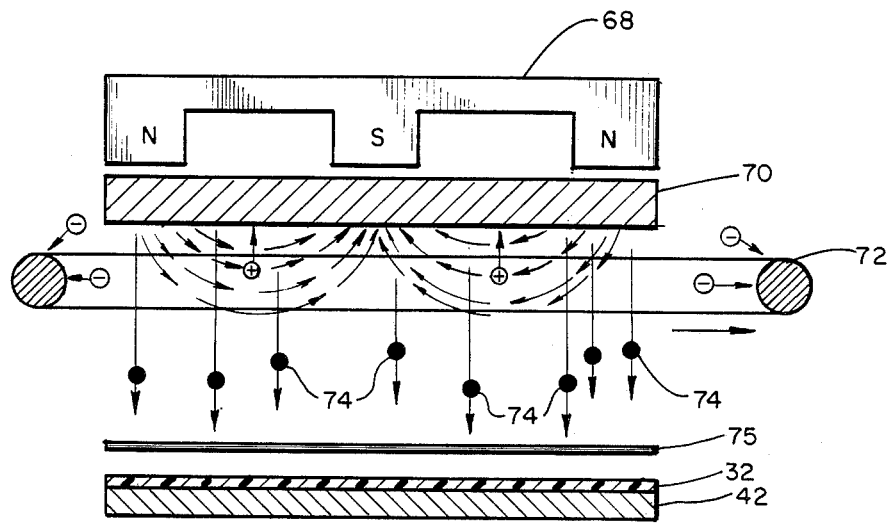
FIG. 4 is a schematic illustration of a method for depositing various materials on a substrate.

FIG. 1 illustrates a method for fabricating substrates for use in thermoelectric generators. A coil 2 of a metal foil 4 is rotatably mounted adjacent one end 6 of a continuous conveyor 8 so that the metal foil 4 may be removed from the coil 2 and deposited on the conveyor 8. A hopper 10 is located above the conveyor 8 and contains a continuous supply of material 12 to be deposited through an opening 14 onto the upper surface of the metal foil 4. The material 12 may comprise any material having good electrical insulating properties and good thermal conducting properties; in the preferred embodiment the material comprises a mixture of vitreous enamel and a plurality of small beads for a purpose to be described below. The conveyor 8 is maintained in continuous motion by suitable means (not shown).

After being deposited on the metal foil 4, the material 12 passes under a series of heaters 16 that apply sufficient heat to the material 12 to liquefy the vitreous enamel. Another coil 18 of a metal foil 20 is rotatably mounted above the conveyor 8 so that the metal foil 20 may be removed from the coil 18 and deposited on the liquefied material 12. A second conveyor 22 is located above a portion of the conveyor 8 and is maintained in continuous motion by suitable means (not shown). The laminate, comprising the metal foil 4, the liquefied material 12 containing the small beads, and the metal foil 20, moves into position between the conveyors 8 and 22. The conveyor 22 exerts a predetermined pressure on the metal foil 20 to force the foil 20 against the liquefied material 12. Movement of the foil 20 against the liquefied material 12 is limited by the small beads. The space between the metal foil 20 and the metal foil 4 is kept uniform by the small beads that are in contact with the metal foil 4 and the metal foil 20. During the passage between the conveyors 8 and 22, the liquefied vitreous enamel hardens and is fused to the adjacent surfaces of the layers of metal foils 4 and 20. At the ends 24 and 26 of the conveyors 8 and 22, suitable means 28 and 30 are provided to cut the continuous laminate of the metal foil 4, the vitreous enamel and small beads, and the metal foil 20 into predetermined lengths to form substrates 32 with the metal foil forming metallic plates on the substrates. A conveyor 34 is provided for moving the substrates 32 to another location for further processing.

FIG. 2 illustrates a portion of a substrate 32 comprising the metal foil 4, the vitreous enamel 36, the small beads 38, and the metal foil 20. In the preferred embodiment, the metal foil comprises copper having a thickness of about 0.0012 to about 0.003 inch. The vitreous enamel 36 comprises a lead oxide based vitreous enamel. The small beads 38 comprise glass having a high silica content and have an average diameter of about 0.002 inch. The heaters 16 supply sufficient heat to raise the temperature of the material 12 to about 600° C. so as to liquefy the lead-based vitreous enamel 36.

A system for processing substrates 32 to provide them with thin thermoelectric semiconductor elements is schematically illustrated in FIG. 3. A conveyor 40 transports a plurality of support plates 42 through a series of work stations. The support plates 42 are spaced a predetermined distance from each other and are moved through the work stations by a plurality of power-driven transport rollers 44. In most instances, the support plate 42 and the substrates 32 are generally the same size. However, the support plates 42 can be substantially larger than the substrates 32 so that a plurality of substrates can be positioned on each support plate. A substrate 32 is positioned in a predetermined location on each of the support plates 42 so that the thin thermoelectric semiconductor elements will be properly positioned. The movement of the power-driven transport rollers is controlled by signals generated by a computer (not shown) to move the support plates 42 over the conveyor 40 and to locate each support plate at a predetermined location at each work station.

After being deposited on a support plate 42, a substrate 32 is moved through an air-lock chamber 46 and then into a buffer chamber 48 wherein the pressure is reduced to a small fraction of an atmosphere, such as from about 100 Pa to about 1000 Pa. The substrate then passes through another air-lock chamber 50 into a cleaning chamber 52 wherein the substrate 32 is exposed to a cleaning operation, such as a plasma of ionized gas, to prepare the substrate for the deposition thereon of a thin thermoelectric semiconductor element. The substrate 32 then passes through one or more air-lock chambers 54 and 56 into another buffer chamber 58 wherein the pressure is further reduced to from about $10^{-1}$ Pa to about $10^{-2}$ Pa.

The cleaned substrate 32 leaves buffer chamber 58 and passes through a plurality of material deposition chambers 60, 62, 64, and 66. The material deposition chambers 60, 62, 64, and 66 are maintained at pressures of from about $10^{-1}$ Pa to about 10 Pa. During deposition as illustrated in FIG. 3, the dimensions of each chamber 60, 62, 64, and 66 correspond generally to the dimensions of each support plate 42 so that the substrate 32 may be readily positioned in the proper predetermined location in each of the chambers 60, 62, 64, and 66. In each of these material deposition chambers, one of the materials to be laminated together to form the thermoelectric semiconductor elements is deposited at predetermined spaced locations on the substrate 32 by a sputtering process schematically illustrated in FIG. 4. A magnet 68 is mounted in a fixed position in each of the material deposition chambers spaced a predetermined distance above the substrate 32 on the support plate 42. A sputtering target 70 is positioned below the magnet 68 and comprises a supply of the material to be deposited on the substrate 32. Immediately below the sputtering target 70, there is an anode 72 having an inner configuration greater than the sputtering target 70. The sputtered atoms 74 move downward through a mask 75 having suitable openings therein to be deposited on the substrate 32. In some instances, the mask 75 may be omitted and a continuous layer of material may be deposited on each substrate. However, since economic considerations are important, the mask is used in most instances. That is, because the difference between thermoelectric generation of electric energy by a continuous layer and thermoelectric generation by spaced locations of the thin thermoelectric semiconductor elements is relatively small, the mask is typically used.

Figure 5:
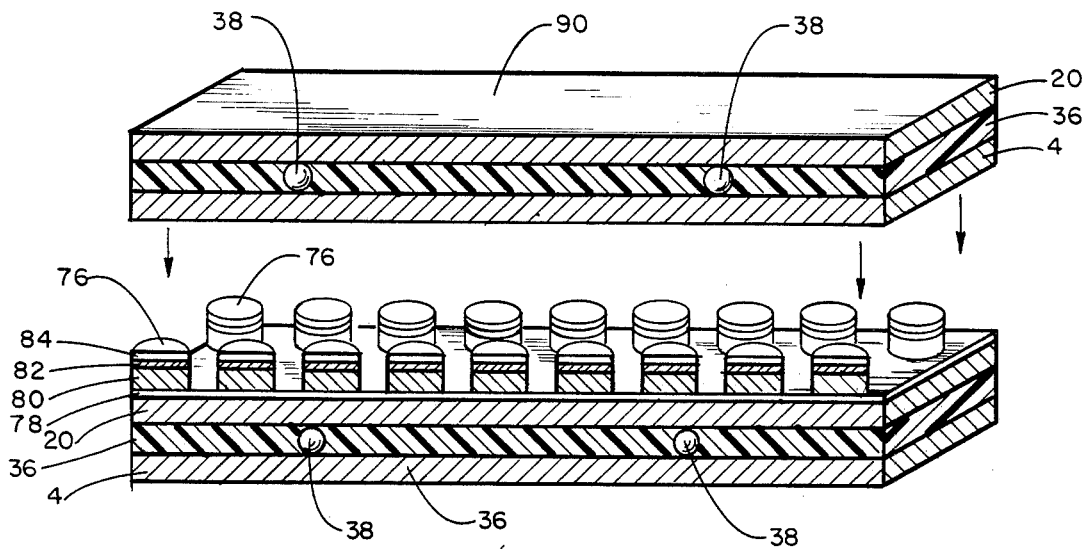
FIG. 5 is a pictorial representation of the lamination of a substrate having thin thermoelectric semiconductor elements secured thereon with a superstrate.

In the preferred embodiment of the invention, the sputtering targets 70 are as follows: nickel in deposition chamber 60, bismuth telluride-antimony selenide in deposition chamber 62, nickel in deposition chamber 64; and solder in deposition chamber 66. The thin thermoelectric elements 76 are illustrated in FIG. 5 wherein each element comprises a layer 78 of nickel secured to the substrate 32, a layer 80 of bismuth telluride-antimony selenide secured to the layer 78 of nickel, a layer 82 of nickel secured to the layer 80 of bismuth telluride-antimony selenide, and a layer 84 of solder secured to the layer 82 of nickel. The layers 78 and 82 of nickel function as diffusion barrier layers, and the layer 80 of bismuth telluride-antimony selenide is the thermoelectric semiconductor film. The substrate 32 moves from deposition chamber 66 through a plurality of buffer chambers 88 and air locks 86 wherein the pressure is gradually increased to substantially one atmosphere.

FIG. 5 illustrates a superstrate 90 about to be positioned in contact with the layers 84 of solder. The superstrate 90 is similar to the substrate 32 and comprises metal foil 4, vitreous enamel 36, small glass beads 38, and metal foil 20. After the superstrate 90 has been moved into contact with the layers 84 of solder, a low-temperature soldering or brazing operation secures the metal foil 4 to the layers 82 of nickel.

Figure 6:
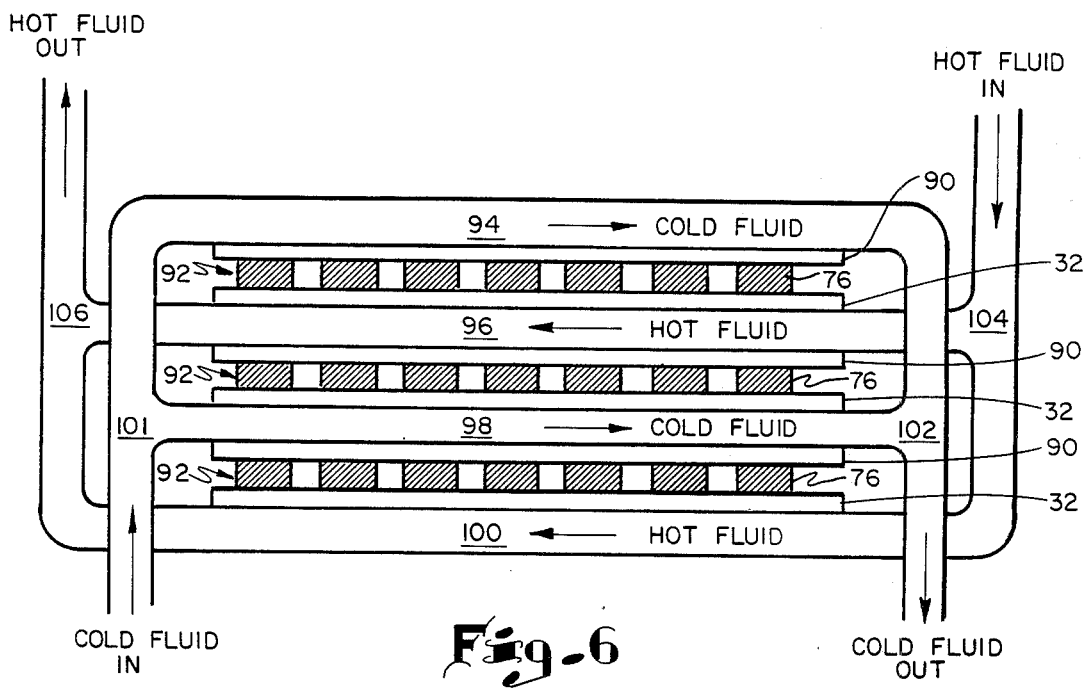
FIG. 6 is a schematic illustration of a thermoelectric generator.

A thermoelectric generator is illustrated schematically in FIG. 6 and uses a plurality of thermoelectric modules 92 wherein each thermoelectric module 92 comprises a substrate 32 and a superstrate 90 having thin thermoelectric semiconductor elements 76 therebetween. A structure comprising spaced apart hollow panels 94, 96, 98, and 100 is provided so that the plurality of thermoelectric modules 92 may be positioned between and in contact with the hollow panels 94, 96, 98, and 100. As shown in FIG. 6, one side of each thermoelectric module 92 is adjacent to a cold fluid and the other side is adjacent to a hot fluid. The panels 94 and 98 are connected to means 101 through which cold fluid is supplied and to means 102 through which the cold fluid is removed. The panels 96 and 100 are connected to means 104 through which hot fluid is supplied and to means 106 through which the hot fluid is removed. The number of panels 94, 96, 98, and 100 used will depend on the size of thermoelectric generator desired. In the thermoelectric generator illustrated in FIG. 6, only one type of semiconductor element, i.e., n-type or p-type, is used. The use of only one type of semiconductor element is advantageous since at various times the costs of the materials is different so that the most economical material may be selected. Also, since only one type is being used, the manufacturing process does not have to be interrupted.

In some instances, the metal foil 20 may be omitted so that in the assembled thermoelectric generator there will be no metal layer between the material 12 having good electrical insulating properties and good thermal conducting properties and the surfaces of the panels 94, 96, 98, and 100. For manufacturing purposes, the upper conveyor 22 would comprise a material that would not stick to the material 12.

Figure 7:
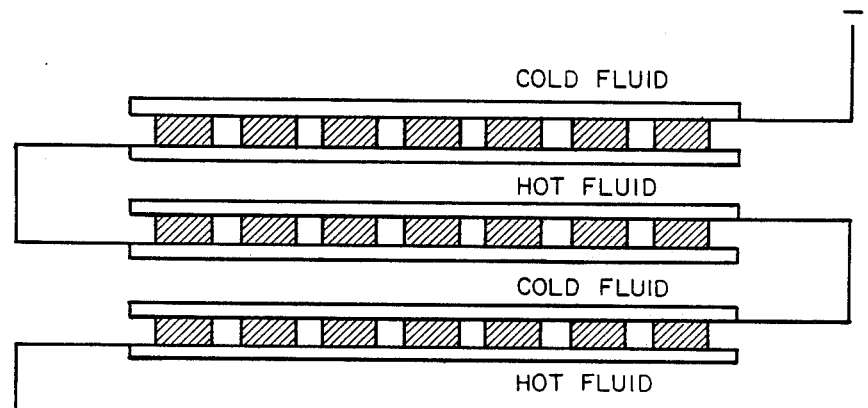
FIG. 7 is a schematic illustration of an electric circuit for use with the thermoelectric generator of FIG. 6.

FIG. 7 illustrates an electrical circuit for use with a thermoelectric generator as illustrated in FIG. 6 and wherein the semiconductor element is n-type. The negative and positive sides of the thermoelectric modules 92 are connected in series.

The foregoing illustrates only the principles of the invention. Further, since numerous modifications and changes will readily occur to those skilled in the art, it is not desired to limit the invention to the exact construction and operation shown and described. Accordingly all suitable modifications and equivalents may be resorted to falling within the scope of the invention as defined by the claims that follow.

The embodiments of the invention in which an exclusive property or privilege is claimed are defined as follows:

1. A method for fabricating a thermoelectric generator comprising the steps of:
    forming a plurality of substrates with a thermally conductive and electrically conductive metallic plate on at least one surface of each substrate;
    forming at least one thin thermoelectric semiconductor element on the plates of some of said substrates to form a first thermal and electrical junction at the interface of the substrate plate and the thermoelectric semiconductor element on the substrates;
    using others of said substrates as superstrates and connecting the plate of each superstate to the side of said thermoelectric semiconductor element opposite said substrate to form a second thermal and electrical junction at the interface of each superstrate plate and the respective thermoelectric semiconductor, thereby form a plurality of modules with each module comprising said thin thermoelectric semiconductor element located between a substrate and a superstrate; and
    using a plurality of said modules to form a thermoelectric generator by arranging said modules so that one junction of each module is positioned adjacent and in thermal contact with a hot fluid carrying conduit and the other junction of each module is positioned adjacent and in thermal contact with a cold fluid carrying conduit and electrically connecting said modules by connecting electrical conductors from the plates on the hot sides of the modules to the plates on the cold sides of respective adjacent modules.

2. A method as in claim 1 wherein said substrates are formed by a method comprising the steps of:
    fusing together in a continuous process a continuous layer of an electrically insulative and thermally conductive material to and between a continuous first layer of metal and a continuous second layer of metal and including spacer means in said electrically insulative and thermally conductive material for insuring uniform spacing between said first and second layers; and
    dividing the resulting laminated structure of said continuous layer of said material and spacer means and said continuous first and second layers of metal to form a plurality of substrates with one of said layers of metal on each substrate forming said electrically conductive metallic plate.

3. A method as in claim 2 and further comprising the steps of:

forming each of said first and second layers of metal from an elongated strip of metal foil; and using small beads of substantially uniform diameter as said spacer means.

4. A method as in claim 3 and further comprising the steps of:

using copper as said metal foil;

using glass beads of high silica content as said small beads; and using a lead-based vitreous enamel as said material.

5. A method as in claim 1 wherein said thermoelectric semiconductor element is formed by a method comprising the steps of:

feeding a plurality of said substrates through a closed vacuum system;

maintaining portions of said closed vacuum system at pressures comprising only a small fraction of one atmosphere; and in one of said portions of said closed vacuum system comprising only a small fraction of one atmosphere, forming at least one thin thermoelectric semiconductor element on the metallic plate on each of said substrates.

6. A method as in claim 5 wherein said feeding of said plurality of substrates through a closed vacuum system comprises the steps of:

providing a continuous endless conveyor extending through said closed vacuum system and having a plurality of support plates associated therewith;

feeding at least one substrate onto each of said support plates;

providing at least a first air lock means at an entrance to said closed vacuum system and moving said substrates from the atmosphere into said closed vacuum system through said first air lock means;

moving each of said substrates from said first air lock means into a buffer chamber;

forming in said buffer chamber a pressure comprising only a small fraction of one atmosphere;

moving each of said substrates from said buffer chamber into a deposition zone;

maintaining said deposition zone at a pressure comprising only a small fraction of one atmosphere;

forming on said metallic plate of each of said substrates a plurality of spaced apart thin thermoelectric semiconductor elements in said deposition zone;

moving each of said substrates from said deposition zone to another buffer chamber;

forming in said another buffer chamber a pressure substantially equal to one atmosphere; and providing second air lock means at an exit from said buffer chamber and moving each of said substrates from said another buffer chamber through said second air lock means to atmosphere.

7. A method as in claim 5 and further comprising the steps of forming on the metallic plate of each of said substrates a plurality of spaced apart thin thermoelectric semiconductor elements by a process comprising the steps of:

moving each of said substrates into a deposition zone;

dividing said deposition zone into a plurality of deposition chambers;

maintaining each of said deposition chambers at a pressure comprising only a small fraction of one atmosphere;

forming in said deposition chambers a plurality of laminates comprising individual layers of material that constitute the thin thermoelectric semiconductor elements.

8. A method as in claim 7 and further comprising the steps of:

depositing on the metallic plate of each of said substrates in a first of said deposition chambers a plurality of spaced apart layers of nickel;

depositing on each of said layers of nickel in a second of said deposition chambers a layer of semiconductor material;

depositing on each of said layers of semiconductor material in a third of said deposition chambers a layer of nickel; and depositing on each of said layers of nickel in a fourth of said deposition chambers a layer of a securing material.

9. A method as in claim 8 and further comprising the steps of:

using a bismuth telluride-antimony selenide compound as said semiconductor material.

10. A method as in claim 9 and further comprising the steps of:

using sputtering processes in said plurality of deposition chambers to form said respective layers of said laminate.

11. A method as in claim 1 and further comprising the steps of:

forming each of said substrates as a laminate comprising at least a layer of material having electrical insulating and thermal conducting properties and a layer of metal foil as said metallic plate;

forming each of said modules with said semiconductor element sandwiched between the respective layers of metal foil of two of said substrate laminates;

providing a structure having a plurality of spaced apart hollow panels forming fluid carrying conduits;

mounting at least one of said modules between adjacent hollow panels with one of said junctions positioned in thermal contact with one of said adjacent hollow panels and the other of said junctions positioned in thermal contact with the other of said adjacent hollow panels;

passing in hot fluid through one of said adjacent hollow panels and passing cold fluid through the other of said adjacent hollow panels; and connecting electrical conductors to the metallic plates of said modules for conducting electric current produced by said thermoelectric semiconductor element.

12. A method of fabricating a thermoelectric generator, comprising the steps of:

forming a plurality of thermoelectric modules by positioning a thin layer of thermoelectric semiconductor material between two spaced apart electrically conductive and heat conductive plates in such a configuration that one side of said thermoelectric semiconductor material forms an electrical and thermal junction with one of said plates and the opposite side of said thermoelectric semiconductor material forms an electrical and thermal junction with the other of said plates;

positioning said thermoelectric modules in spaced apart, stacked relation to each other with a hollow panel positioned in each space between adjacent stacked thermoelectric modules and with said respective plates of said modules positioned in contact with the hollow panels in such a manner that the plates on opposite sides of said modules are in contact with a different hollow panel;

connecting every other one of said hollow panels together with first manifolding means to form a first common fluid carrying network for conducting hot fluid adjacent the respective plates of said thermoelectric modules that are positioned in contact with the hollow panels of said first common fluid carrying network to form a hot junction on one side of each thermoelectric module;

connecting the remaining hollow panels together with second manifolding means to form a second common fluid carrying network for conducting cold fluid adjacent the respective plates of said thermoelectric modules that are positioned in contact with the hollow panels of said second common fluid carrying network to form a cold junction on the opposite side of each thermoelectric panel; and electrically connecting the plurality of thermoelectric panels in series by connecting electrical conductors between the respective plates on the hot junction sides of the thermoelectric modules to the respective plates on the cold junction sides of adjacent thermoelectric modules.

13. The method of claim 12, wherein the thermoelectric semiconductor material used in the step of forming a plurality of thermoelectric modules is only p-type.

14. The method of claim 12, wherein the thermoelectric semiconductor material used in the step of forming a plurality of thermoelectric modules is only n-type.

15. The method of claim 12, wherein the thermoelectric semiconductor material used in the step of forming a plurality of thermoelectric modules is bismuth telluride-antimony selenide.

16. The method of claim 12, including the step of forming each of said thermoelectric modules with a plurality of individual thin thermoelectric semiconductors positioned in spaced apart relation to each other between said plates so that only a portion of the surface area of each plate is in contact with said thermoelectric semiconductor material.

17. The method of claim 12, wherein the step of forming said thermoelectric modules also includes the further steps of forming a plurality of substrates by laminating an electrically and heat conductive first layer of metal foil on an elongated layer of heat conductive and electrically nonconductive material, cutting said elongated laminate of heat conductive and electrically nonconductive material and metal foil into segments of predetermined length, each segment being a substrate with the metal foil on each substrate being one of said plates.

18. The method of claim 17, wherein the step of forming said thermoelectric modules also includes the steps of depositing said thermoelectric semiconductor material on the plates of some of said substrates to form one of said junctions and using others of said substrates as superstrates by adhering the plate of a superstrate on the side of the deposited thermoelectric semiconductor material on each substrate to form the other of said junctions of each thermoelectric module.

19. The method of claim 18, further including the steps of positioning diffusion barrier means between the respective sides of thermoelectric semiconductor material and said plates.

20. The method of claim 19, further including the steps of depositing a first layer of nickel on the plate of said substrate to form one of said diffusion barrier means, depositing said thermoelectric semiconductor material on said layer of nickel, and depositing a second layer of nickel on said thermoelectric semiconductor material to form the other of said diffusion barrier means.

21. The method of claim 20, further including the steps of depositing a layer of solder on said second layer of nickel and adhering said solder to the plate of said superstrate.

22. The method of claim 21, including the steps of depositing said diffusion barrier means, thermoelectric semiconductor material, and solder by vacuum sputtering.

23. The method of claim 22, including the steps of positioning some of said substrates on a conveyor and conveying each of said substrates on said conveyor through a first set of air lock and buffer chambers wherein pressure is reduced to a small fraction of an atmosphere and into a first vacuum sputtering chamber and sputtering said first layer of nickel on the plate of each of said substrates, conveying each of said substrates into a second vacuum sputtering chamber and sputtering said thermoelectric semiconductor material onto said first nickel layer, conveying each of said substrates into a third vacuum sputtering chamber and sputtering said second nickel layer onto said thermoelectric semiconductor material, conveying each of said substrates into a fourth vacuum sputtering chamber and sputtering a layer of solder onto said second nickel layer, and conveying each of said substrates through a second set of air lock and buffer chambers wherein pressure is increased back to atmosphere.

24. The method of claim 23, including the step of adhering a superstrate onto said solder layer by positioning the plate of a superstrate on the solder layer and heating the plates on said superstrate to a temperature high enough to melt the solder, then allowing it to cool.

25. The method of claim 23, including the step of positioning a mask having a plurality of openings therethrough over the substrate in said second, third, and fourth vacuum sputtering chambers to allow said thermoelectric semiconductor material, second nickel layer, and solder layer to be deposited only on selected areas of the substrate to form a plurality of thin thermoelectric semiconductor elements on the substrate.

26. The method of claim 17, wherein the step of forming said substrates also includes the steps of depositing powdered vitreous enamel on a first elongated strip of metal foil, heating the powdered vitreous enamel to a sufficient temperature to liquefy the vitreous enamel, positioning a second elongated strip of metal foil on the vitreous enamel, and allowing this resulting composite laminate to cool to solidify the vitreous enamel.

27. The method of claim 26, including the steps of positioning a plurality of glass beads of predetermined uniform size on said first elongated strip of metal foil with said powdered vitreous enamel, and applying sufficient heat to melt the vitreous enamel but not enough heat to melt the glass beads.

* * * * *